(12) United States Patent
Matsui et al.

(10) Patent No.: US 9,291,645 B2
(45) Date of Patent: Mar. 22, 2016

(54) PROBE UNIT (71) Applicant: NHK Spring Co., Ltd., Yokohama-shi (JP)

(72) Inventors: Akihiro Matsui, Nagano (JP); Takashi Mori, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 60 days.

(21) Appl. No.: 14/349,410

(22) PCT Filed: Oct. 4, 2012

(86) PCT No.: PCT/JP2012/075862
§ 371 (c)(1),
(2) Date: Apr. 3, 2014

(87) PCT Pub. No.: WO2013/051675
PCT Pub. Date: Apr. 11, 2013

(65) Prior Publication Data
US 2015/0285840 A1    Oct. 8, 2015

(30) Foreign Application Priority Data
Oct. 7, 2011    (JP) .................................. 2011-223359

(51) Int. Cl.
*G01R 1/073*    (2006.01)
*G01R 31/28*    (2006.01)
(Continued)

(52) U.S. Cl.
CPC ........ *G01R 1/07314* (2013.01); *G01R 1/06722* (2013.01); *G01R 31/2886* (2013.01); *G01R 31/2889* (2013.01); *G09G 3/006* (2013.01)

(58) Field of Classification Search
None
See application file for complete search history.

(56) References Cited

U.S. PATENT DOCUMENTS

| 5,003,255 A | * | 3/1991 | Kazama | G01R 1/06722 324/72.5 |
| 5,004,977 A | * | 4/1991 | Kazama | G01R 1/06722 324/72.5 |
| 5,291,129 A | * | 3/1994 | Kazama | G01R 1/06738 324/750.26 |

(Continued)

FOREIGN PATENT DOCUMENTS

| JP | 02-234066 A | 9/1990 |
| JP | 4-59464 U | 5/1992 |

(Continued)

OTHER PUBLICATIONS

Supplementary European Search Report dated Jun. 23, 2015, issued for the European Patent Application No. 12837740.5.

(Continued)

*Primary Examiner* — Jermele M Hollington
*Assistant Examiner* — Suresh K Rajaputra
(74) *Attorney, Agent, or Firm* — Locke Lord LLP (57) ABSTRACT

A probe unit includes: contact probes; and a probe holder, each of the contact probe including a plunger and a spring coil, each of the plunger including: a contact portion contacting an electrode of a contacted body; a flange portion extending from a base end of the contact portion and having a diameter larger than a diameter of the contact portion; a boss portion extending from an end of the flange portion different from an end continuing to the contact portion and having a diameter smaller than the diameter of the flange portion; and a base end portion extending from an end of the boss portion different from an end continuing to the flange portion and having a substantially same diameter with the boss portion.

8 Claims, 6 Drawing Sheets

(51) Int. Cl.
*G01R 1/067* (2006.01)
*G09G 3/00* (2006.01)

(56) References Cited

U.S. PATENT DOCUMENTS

| | | | | |
|---|---|---|---|---|
| 6,323,667 | B1* | 11/2001 | Kazama | G01R 1/06722 324/755.05 |
| 7,057,403 | B2* | 6/2006 | Kazama | G01R 1/06772 324/755.05 |
| 7,282,378 | B2* | 10/2007 | Yoshida | G01R 1/045 257/48 |
| 7,459,922 | B2* | 12/2008 | Kazama | G01R 1/06772 324/755.05 |
| 7,677,901 | B1* | 3/2010 | Suzuki | G01R 1/0466 439/66 |
| 7,950,927 | B2 | 5/2011 | Kazama et al. | |
| 7,969,170 | B2* | 6/2011 | Kazama | G01R 1/06772 324/754.01 |
| 8,018,242 | B2* | 9/2011 | Nakayama | G01R 31/2889 324/755.01 |
| 8,149,008 | B2* | 4/2012 | Yamada | G01R 1/06722 324/500 |
| 8,344,747 | B2* | 1/2013 | Kazama | G01R 1/07371 324/755.01 |
| 8,471,576 | B2* | 6/2013 | Kiriki | G01R 1/0458 324/754.01 |
| 8,723,540 | B2* | 5/2014 | Yamamoto | G01R 1/06722 324/754.11 |
| 2004/0232934 | A1* | 11/2004 | Sinclair | G01R 1/0466 324/755.05 |
| 2005/0266734 | A1* | 12/2005 | Kazama | G01R 1/07314 439/700 |
| 2008/0164893 | A1* | 7/2008 | Lee | G01R 1/07342 324/754.07 |
| 2010/0123476 | A1* | 5/2010 | Kazama | G01R 1/06772 324/755.01 |
| 2012/0019277 | A1* | 1/2012 | Kazama | F16F 1/021 324/755.05 |
| 2013/0099814 | A1* | 4/2013 | Kazama | G01R 1/06722 324/755.05 |
| 2014/0162503 | A1* | 6/2014 | Yamada | H01R 4/4863 439/786 |
| 2014/0253163 | A1* | 9/2014 | Suzuki | G01R 1/06733 324/755.05 |

FOREIGN PATENT DOCUMENTS

| | | |
|---|---|---|
| JP | 07-049417 Y2 | 11/1995 |
| JP | 09-312185 A | 12/1997 |
| JP | 3090255 U | 11/2002 |
| JP | 2005-049163 A | 2/2005 |
| JP | 2006-351474 A | 12/2006 |
| JP | 2010-267502 A | 11/2010 |
| KR | 10-2001-0021666 A | 3/2001 |
| KR | 10-2008-0063530 A | 7/2008 |
| KR | 10-2009-0089907 A | 8/2009 |
| TW | 2008-31913 A | 8/2008 |
| TW | 200923384 A | 6/2009 |
| WO | WO-99/04274 A1 | 1/1999 |
| WO | WO-2007/052557 A1 | 5/2007 |
| WO | WO-2011/013731 A1 | 2/2011 |

OTHER PUBLICATIONS

Office Action dated Jun. 12, 2013 issued in Taiwanese Application No. 101137084.
Office Action dated Dec. 1, 2014, issued for the Taiwanese patent application No. 101137084.
Office Action dated Mar. 18, 2015, issued for the Korean patent application No. 10-2014-7010784.
International Search Report dated Nov. 6, 2012, issued for PCT/JP2012/075862.
Office Action dated Sep. 11, 2015, issued for the corresponding Philippine patent application No. 1-2014-500743.
Notice of Allowance dated Dec. 7, 2015, issued for the corresponding Korean patent application No. 10-2014-7010784.

* cited by examiner

PROBE UNIT

FIELD

The present invention relates to a unit for use in a continuity test or an operation characteristics test for a test target such as a semiconductor integrated circuit, an LCD panel and the like.

BACKGROUND

Conventionally, a probe unit that accommodates a plurality of contact probes therein is used for establishing an electric connection between a test target such as a semiconductor integrated circuit, an LCD panel, etc. and a signal processor that outputs a test signal when performing a continuity test or an operation characteristics test. For probe units a technology applicable to highly-integrated and micro-fabricated test targets has progressed by narrowing a pitch between contact probes along with progresses in high integration and micro-fabrication of semiconductor integrated circuits and LCD panels in recent years.

As the above described probe unit, it is disclosed that a probe unit has a contact probe having two end portions contacting an electrode of a semiconductor integrated circuit and an electrode of a circuit board outputting a test signal, respectively, to electrically connect the semiconductor integrated circuit with the circuit board (for example, see Patent Literatures 1 and 2).

A contact probe disclosed in Patent Literature 1 includes a first conductive member that contacts an electrode of a semiconductor integrated circuit a second conductive member that contacts an electrode of a circuit board outputting a test signal, and a conductive spring coil that joins the first conductive member with the second conductive member and biases the first conductive member and the second conductive member. A contact probe disclosed in Patent Literature 2 cools an inside of the contact probe by using a cylindrical conductive member penetrating the contact probe in a longitudinal direction to suppress an increase in a resistance value by the cooling.

Moreover, it is disclosed that a probe unit includes a contact probe having a contact portion that contacts an electrode of a semiconductor integrated circuit and an elastic portion connected with a conducting wire connected with a circuit board, etc. that outputs a test signal. The elastic portion contacts an end portion of the contact portion at a side different from a side contacting the semiconductor integrated circuit (for example, see Patent Literature 3).

Furthermore, it is disclosed that a probe unit includes a contact probe having an elastically deformable elastic conductive plate member contacting an electrode of a semiconductor integrated circuit and a guide cylinder guiding an extension/retraction direction of the elastic conductive plate member (for example, see Patent Literature 4).

CITATION LIST

Patent Literatures

Patent Literature 1: International Publication WO2011/013731

Patent Literature 2: Japanese Patent Application Laid-Open No. 2010-267502

Patent Literature 3: Japanese utility model registration No. 3090255

Patent Literature 4: Japanese Patent. Application Laid-Open No. H09-312185

SUMMARY

Technical Problem

In recent years, a demand is growing for a contact probe capable of flowing a large current of about 1000 A or larger for performing a test on a semiconductor for an automobile control system or the like. However, the conventional contact probe disclosed in Patent Literature 1 was not suitable for flowing a large current because it includes a spring coil in a conduction path and so conduction must be established between many contacts, e.g., establishing the conduction between the first and the second conductive members and the spring coil, and establishing the conduction via the contacts of the first conductive member and the second conductive member.

Moreover, in the conventional contact probes disclosed in Patent Literatures 2 to the conductions were established via a plate-shaped or a line-shaped member, and thus a cross-section of a conduction path was small; therefore, they were not suitable for flowing a large current.

The present invention has been made in view of the above-mentioned circumstances and an object thereof is to provide a probe unit which is capable of establishing a secure conduction with a contact target even if a large current flows.

Solution to Problem

To solve the problem described above and achieve the object, a probe unit contacting an electrode of a contacted body and an electrode of a contact target at both ends in a longitudinal direction includes: a plurality of conductive contact probes, each contacting the electrode of the contacted body at one end in the longitudinal direction; and a probe holder accommodating the plurality of contact probes, wherein each of the contact probe includes: a plunger including: a contact portion contacting the electrode of the contacted body; a flange portion extending from a base end of the contact portion and having a diameter larger than a diameter of the contact portion; a boss portion extending from an end of the flange portion different from an end continuing to the contact portion and having a diameter smaller than the diameter of the flange portion; and a base end portion extending from an end of the boss portion different from an end continuing to the flange portion and having a substantially same diameter with the boss portion; and a spring coil attached to the boss portion, the probe holder is made of a conductive material and includes a plurality of holder holes, each having a stepped shape in which diameters at both ends in a thickness direction are decreased and accommodating the respective contact probes, and the flange portion abuts one of step portions of the stepped shape, and the spring coil abuts another one of the step portions such that the spring coil biases the plunger.

In the above-described probe unit according to the present invention, the base end portion is connected with the electrode of the contact target by a conductive member.

In the above-described probe unit according to the present invention, the conductive member is a wire.

In the above-described probe unit according to the present invention, the conductive member is wound around the base end portion.

In the above-described probe unit according to the present invention, the probe holder contacts the electrode of the contact target.

In the above-described probe unit according to the present invention, at least one of the contact portion and the base end portion of the contact probe contacts a wall surface of the holder hole.

In the above-described probe unit according to the present invention, the probe holder includes a large diameter section communicating with an outside thereof and being formed in an area including the holder holes.

In the above-described probe unit according to the present invention, an end of the base end portion is positioned in the large diameter section.

According to the present invention, an electric conduction is established between the boards with reducing the number of contacts in the conduction path of the probe; therefore, it is possible to obtain an effect of a secure conduction between the contact probe and the contact target even if a large current flows.

DESCRIPTION OF EMBODIMENT

Embodiments for carrying out the present invention will be described below together with the accompanying drawings. The present invention is not limited by the following embodiments. The drawings to be referred to in the following description merely schematically illustrate shapes, sizes, and positional relations to the extent of allowing the details of the present invention to be understood. In other words, the present invention is not limited to the shapes, sizes, and positional relations illustrated in the drawings.

Figure 1:
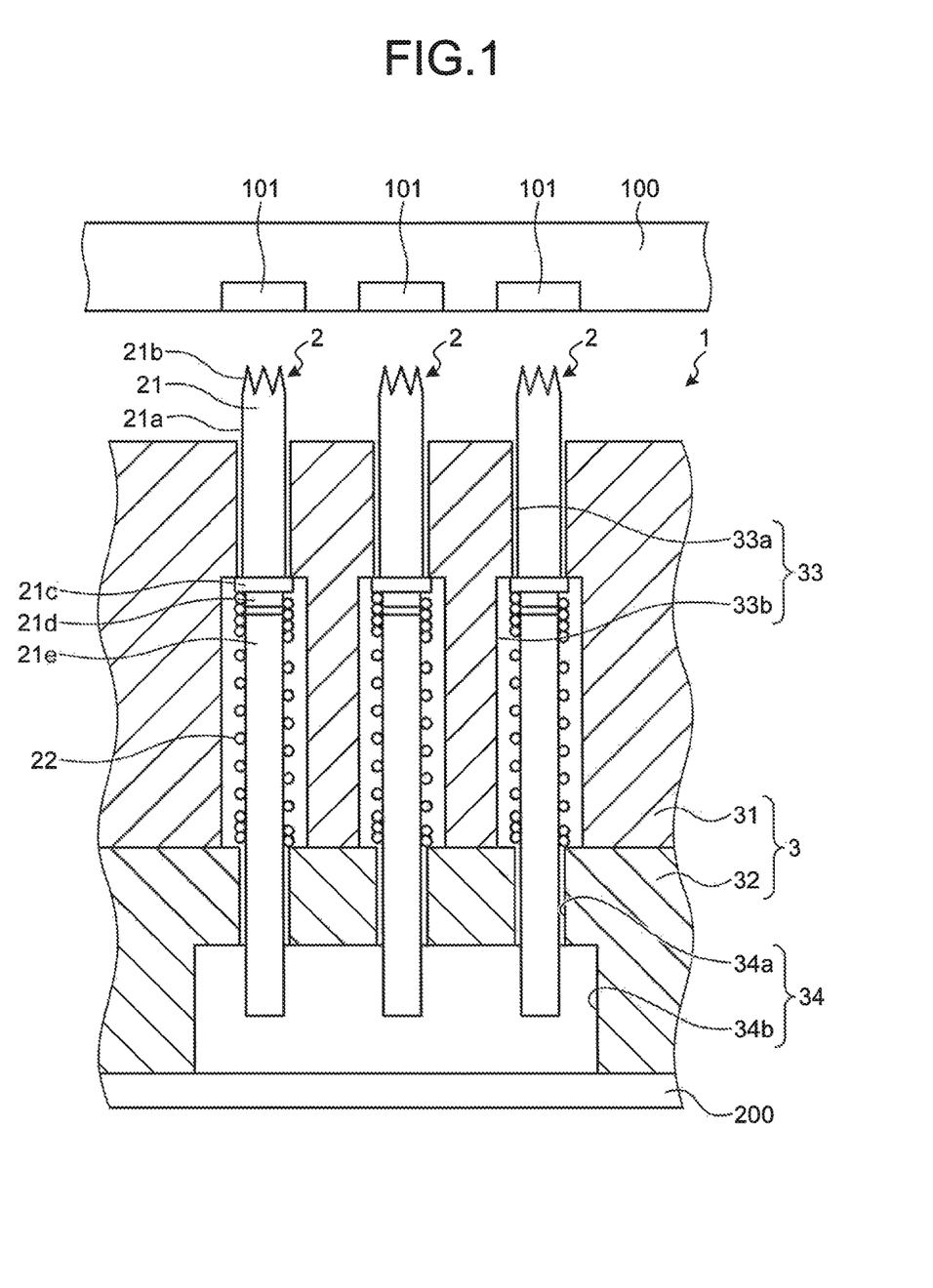
FIG. 1 is a partial cross-sectional view illustrating a configuration of an essential part of a probe unit according to an embodiment of the present invention.

FIG. 1 is a partial cross-sectional view illustrating a configuration of an essential part of a probe unit according to the embodiment. A probe unit 1 illustrated in FIG. 1 is a device used for testing electric characteristics of or supplying power to a semiconductor integrated circuit 100 as a test target, and is a device that establishes electrical connection between the semiconductor integrated circuit 100 and a circuit board outputting a test signal to the semiconductor integrated circuit 100 or wirings 200 (electrodes) each connected with the circuit board or the like.

The probe unit 1 includes: contact probes 2 (hereinafter, simply referred to as "probes 2") each contacting, at one end in a longitudinal direction, an electrode of the semiconductor integrated circuit 100 as the contact target; and a plurality of probe holders 3, each provided in correspondence with the respective probe 2, to accommodate and hold the plurality of probes 2 according to a predetermined pattern.

The probes 2 are made of a conductive material and disposed in parallel in the probe holders 3 so that the probes 2 are aligned in height. The probe 2 includes: a plunger 21 substantially in a column shape and contacting a connection electrode 101 of the semiconductor integrated circuit 100 while testing the semiconductor integrated circuit 100; and a spring coil 22 that is joined to the plunger 21 so that the plunger 21 is capable of extending or retracting. The plunger 21 and the spring coil 22 forming the probe 2 have the same axis. The stretching and the compression of the spring coil 22 in the direction of the axis when the probe 2 contacts the connection electrode 101 of the semiconductor integrated circuit 100 reduce an impact on the connection electrode 101 of the semiconductor integrated circuit 100 and apply a load to the semiconductor integrated circuit 100.

On the same axis the plunger 21 includes: an end portion 21a (contact portion) which is made of a beryllium copper, etc., whose outer surface is gold-plated and which has a plurality of nail portions 21b each having a conical end shape; a flange portion 21c extending from a base end side of the end portion 21a and having a diameter larger than a diameter of the end portion 21a; a boss portion. 21d extending from an end portion of the flange portion 21c, which is a different side from a side continuing to the end portion 21a and has a diameter smaller than the diameter of the flange portion 21c; and a base end portion. 21e extending from an end portion of the boss portion 21d, which is a different side from a side continuing to the flange portion 21c and having a diameter that is approximately the same as the diameter of the boss portion 21d.

The spring coil 22 made of a stainless steel, etc. and is wound at an inner diameter that is substantially the same as the diameter of the boss portion 21d. In case where an inner diameter of an end portion of the spring coil 22 at a side joining to the plunger 21 is substantially the same as the diameter of the boss portion 21d, for example, the end portion is press-fit to the boss portion 21d to contact the flange portion 21c. The spring coil 22 may include a tight wound section in which the spring coil 22 is wound tightly and a rough wound section in which the spring coil 22 is wound by a predetermined pitch at respective end portion sides. The plunger 21 and the spring coil 22 may be joined by soldering. A conductive material having a resistance greater than that of the plunger 21 or an elastic and insulating material may be applicable for forming the spring coil 22.

The probe holder 3 is made of a conductive material such as brass and the like. The probe holder 3 includes a first member 31 illustrated in an upper portion of FIG. 1 stacked on a second member 32 illustrated in a lower portion of FIG. 1. Holder holes 33 and 34 are formed in the first member 31 and the second member 32, respectively, to penetrate in a thickness direction to accommodate the probes 2. Positions at which the holder holes 33 and 34 are formed are determined based on a wiring pattern of the semiconductor integrated circuit 100.

Both the holder holes 33 and 34 are of stepped hole shapes in which diameters thereof change along a penetration direction. That is, the holder hole 33 includes a small diameter section 33a having an opening on an upper end surface of the probe holder 3 and a large diameter section 33b having a diameter which is larger than a diameter of the small diameter section 33a. The diameter of the small diameter section 33a is slightly larger than the diameter of the end portion 21a. The diameter of the large diameter section 33b is slightly larger than the diameter of the flange portion 21c and/or a diameter of the spring coil 22.

The holder hole 34 includes a small diameter section 34a having an opening on an end surface at a side facing the first member 31 and a large diameter section 34b having a diameter which is larger than a diameter of the small diameter section 34a. The diameter of the small diameter section 34a is slightly larger than the diameter of the base end portion 21e. The large diameter section 34b is of the diameter that allows the ends of the base end portions 21e of the respective probes 2 to be accommodated collectively. It is further preferable that the large diameter section 34b opens to an outside of the second member 32 and penetrates at least one of wall surfaces. Shapes of the holder holes 33 and the small diameter sections 34a are determined according to a configuration of the probe 2 to be accommodated. The holder holes 33 and the small diameter sections 34a for accommodating the probes 2 are formed so that an axial line of the holder hole 33 and an axial line of the small diameter section 34a coincide with each other.

The flange portion 21c of the plunger 21 contacting a border wall surface between the small diameter section 33a and the large diameter section 33h of the holder hole 33 has a function of preventing the probe 2 from falling off from the probe holder 3. The end portion of the spring coil 22 at a side which is different from the side joining to the plunger 21 contacts a border wall surface between the first member 31 and the second member 32 (an upper surface of the second member 32). The spring coil 22 is hereby held in the large diameter section 33b and biases the plunger 21 upwardly to an upper surface of the first member 31.

Figure 2:
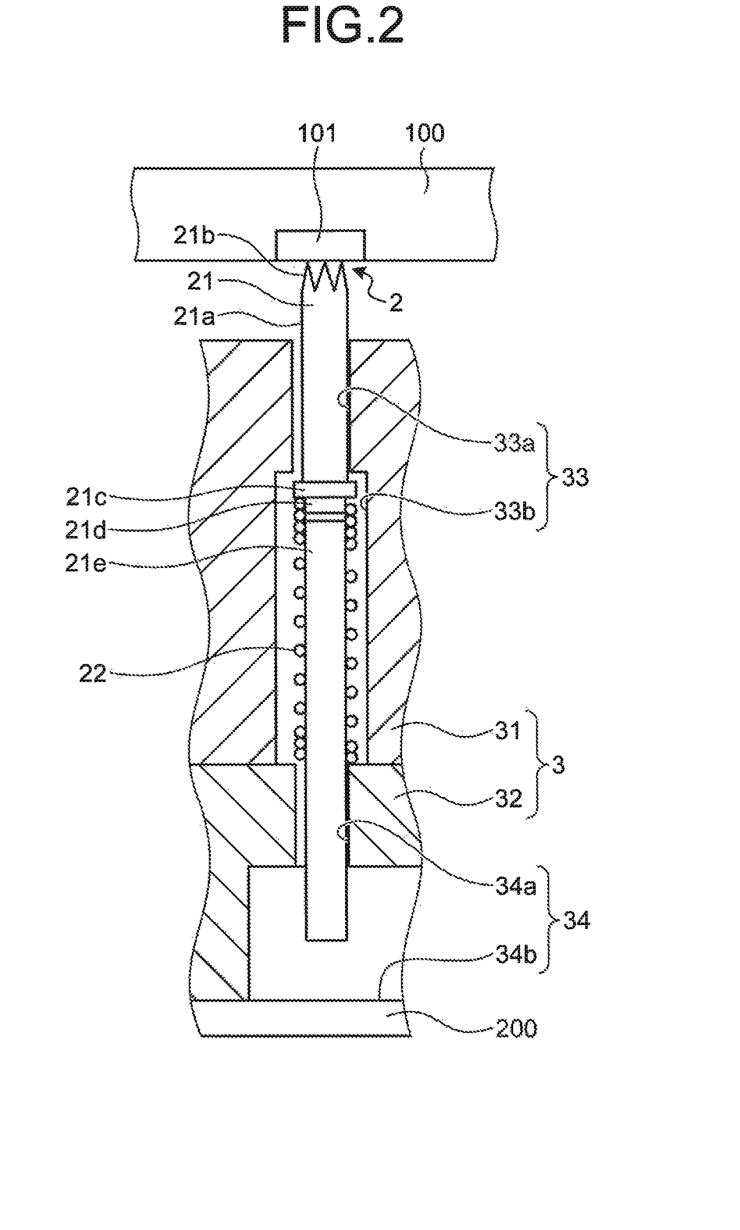
FIG. 2 is a partial cross-sectional view illustrating a configuration of an essential part of a probe unit when testing a semiconductor integrated circuit according to the embodiment of the present invention.

FIG. 2 is a partial cross-sectional view illustrating a state of the semiconductor integrated circuit. 100 when tested by using the probe holder 3. When testing the semiconductor integrated circuit 100, the spring coil 22 is compressed in the longitudinal direction by a contact load applied from the semiconductor integrated circuit 100. When the spring coil 22 is compressed, the base end portion 21e of the plunger 21 enters the large diameter section 34h as illustrated in FIG. 2. When the spring coil 22 slightly meanders by the load applied from the semiconductor integrated circuit. 100 or the like, the direction of the load applied to the plunger 21 changes to cause the plunger 21 to contact inner peripheries (wall surfaces) of the holder holes 33 and 34. For example, the end portion 21a of the plunger 21 in this state contacts a wall surface of the small diameter section 33a, and the base end portion 21e contacts a wall surface of the small diameter section. 34a. A test signal is conducted between the semiconductor integrated circuit 100 and the circuit board via the probe 2 and the probe holder 3.

The test signal supplied from the wiring 200 of the circuit board at the time of the testing reaches the connection electrode 101 of the semiconductor integrated circuit 100 via the probe holder 3 and the probe 2. To be more specific, in case where the end portion 21a contacts the small diameter section 33a in the probe 2, the test signal reaches the connection electrode 101 of the semiconductor integrated circuit 100 via the end portion 21a of the plunger 21. In case where the base end portion 21e contacts the small diameter section 34a, the test signal reaches the connection electrode 101 of the semiconductor integrated circuit 100 via the base end portion 21e, the boss portion 21d, the flange portion 21c and the end portion 21a of the plunger 21. Since the test signal is conducted via the probe holder 3 that is capable of obtaining a larger cross-sectional area for conduction in the probe unit 1, it is possible to increase an allowable current. The base end portion 21e is made to be of a length such that the base end portion 21e does not contact the wiring 200 when moved by the load applied from the semiconductor integrated circuit 100.

Since the number of contacts in the conduction path of the probe is reduced and an electric continuity is established between the boards via the probe holder in the embodiment described above, a secure continuity can be established between the contact probe and the contact target even if a large amount of current flows.

Since the above-described embodiment is configured such that an electric conduction is established between boards via the probe holder but not via the spring coil 22, it is possible to increase a cross-sectional area for conduction in the conduction path to be capable of corresponding to a large amount of current. In case where a cross-sectional area of a conventional plate-shaped or line-shaped contact probe is increased, there may be a problem that a cooling efficiency decreases or elasticity must be obtained, etc., thereby causing a probe unit to be larger in size.

Since the probe holder 3 according to the above-described embodiment is made of a conductive material, the probe holder 3 can absorb heat produced in the probe 2 to dissipate the heat to the outside. Moreover, since the large diameter section 34b opening to the outside defines a space capable of collectively accommodating the base end portions 21e of the respective probes 2 to be accommodated, and since the ends of the respective base end portions 21e are positioned in the space, it is possible to dissipate heat produced when a current flows in the plunger 21 more effectively. Therefore, it is possible to improve a cooling efficiency for the probe unit 1 and prevent probes, etc. from being damaged by heat.

The connection electrode 101 explained in the above described embodiment to be a plate-shaped electrode used for a Quad Flat Non-leaded package (QFN), etc., for example, may alternatively be a plate-shaped lead used for a Quad Flat Package (QFP), etc., or may be a hemispherical connection electrode. Having a plurality of the nail portions of the probe contacted a contact surface of the plate-shaped electrode makes contact areas more constant than in the conventional technique of making a contact between plate-shaped surfaces, and thereby achieving a more stable contact between the probe and the connection electrode.

The probe 2 is not limited to the configuration including the plunger and the spring coil but may be formed by using a pogo pin or a wire probe obtaining a load by bending a wire.

Although it has been explained that the probe 2 contacts the probe holder 3 when the spring coil 22 meanders, the probe 2 may be disposed such that the probe 2 may contact the probe holder 3 in advance when the probe holder 3 accommodates the plunger 21. At least one of the end portion 21a and the base end portion 21e of the probe 2 may contact the probe holder 3 (wall surfaces of the holder holes 33 and 34).

Figure 3:
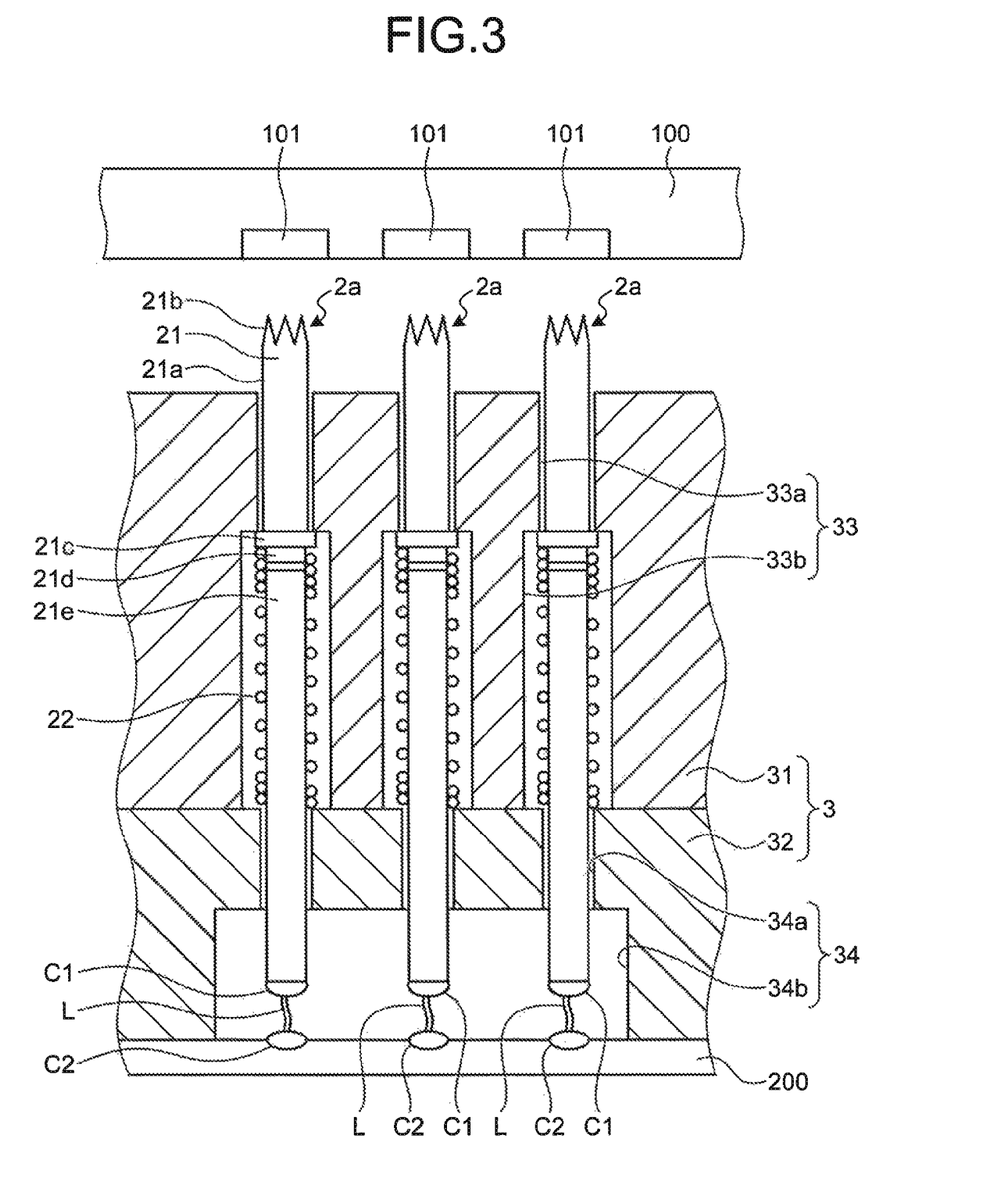
FIG. 3 is a partial cross-sectional view illustrating a configuration of an essential part of a probe unit according to a first modification of the embodiment of the present invention.

FIG. 3 is a partial cross-sectional view illustrating a configuration of an essential part of a probe unit according to a first modification of the present embodiment. The base end portion 21e of the plunger 21 explained not to be conducted directly to the wiring 200 in the above-described embodiment may alternatively be conducted directly to the wiring 200.

A probe 2a illustrated in FIG. 3 has a lead L as a conductive wire connecting between the above-described base end portion 21e of the plunger 21 and the wiring 200. The lead L is fixed to the base end portion 21e and the wiring 200 by solders C1 and C2, respectively.

Since the plunger 21 is connected to the wiring 200 via the lead. L, an electric conduction between boards can be achieved by a mere contact between the end portion 21a and the connection electrode 101.

A combination with an electric conduction between the wiring 200 and the plunger 21 contacting the probe holder 3 according to the above-described embodiment enables a larger current to flow.

Figure 4:
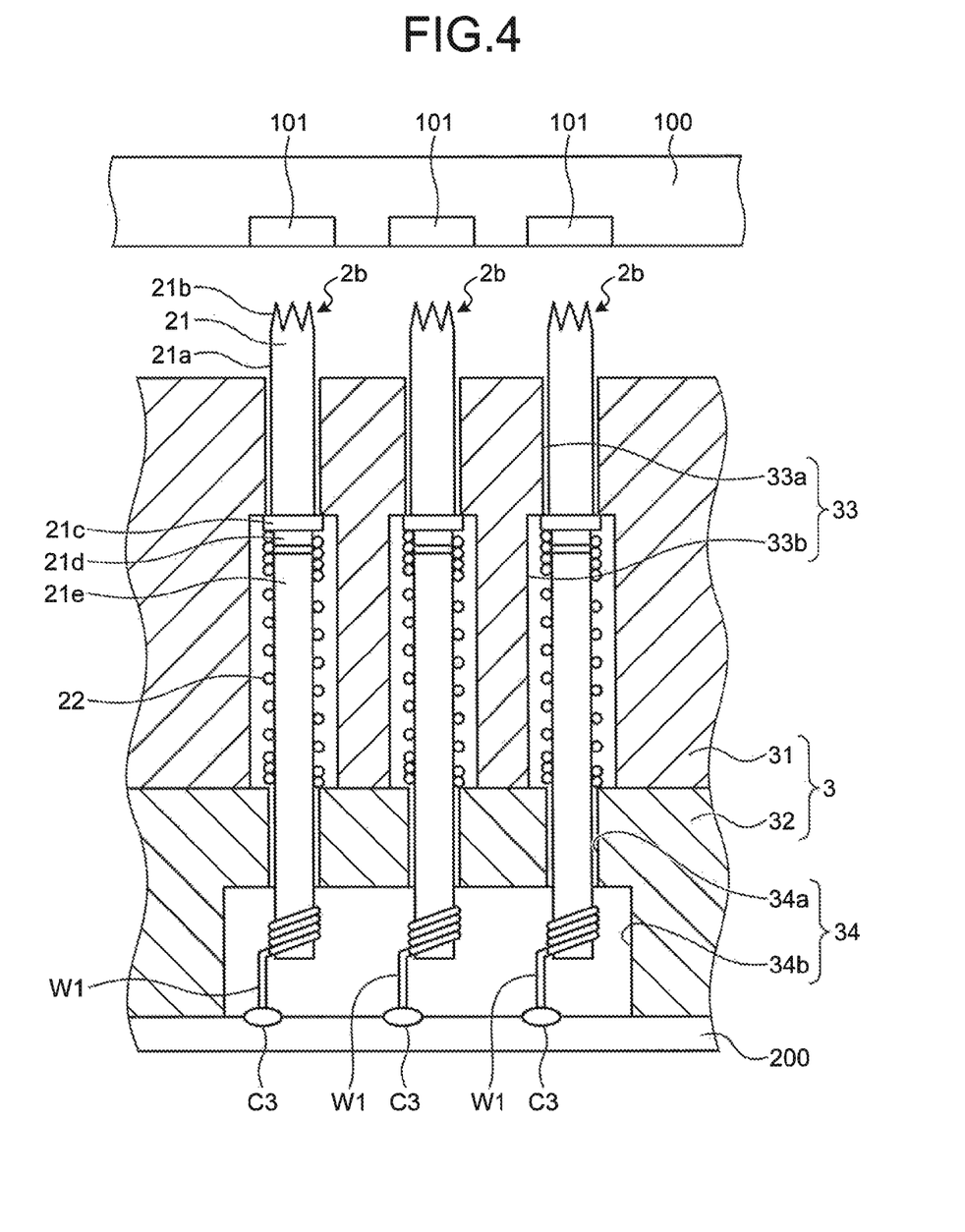
FIG. 4 is a partial cross-sectional view illustrating a configuration of an essential part of a probe unit according to a second modification of the embodiment of the present invention.

FIG. 4 is a partial cross-sectional view illustrating a configuration of an essential part of a probe unit according to a second modification of the present embodiment. The base end portion 21e of the plunger 21 explained not to be conducted directly to the wiring 200 in the embodiment described above may alternatively be conducted directly to the wiring 200.

A probe 2b illustrated in FIG. 4 has a wire W1 as a conductivity wire connecting between the above-described base end portion 21e of the plunger 21 and the wiring 200. The wire W1 is wound and fixed around the base end portion 21e and fixed to the wiring 200 by a solder C3 to allow the base end portion 21e to move slidably.

Since the plunger 21 and the wiring 200 are connected by the wire W1, an electric conduction between boards can be achieved by a fewer contacts.

A combination with an electric conduction between the wiring 200 and the plunger 21 contacting the probe holder 3 according to the above-described embodiment enables a larger current to flow.

Figure 5:
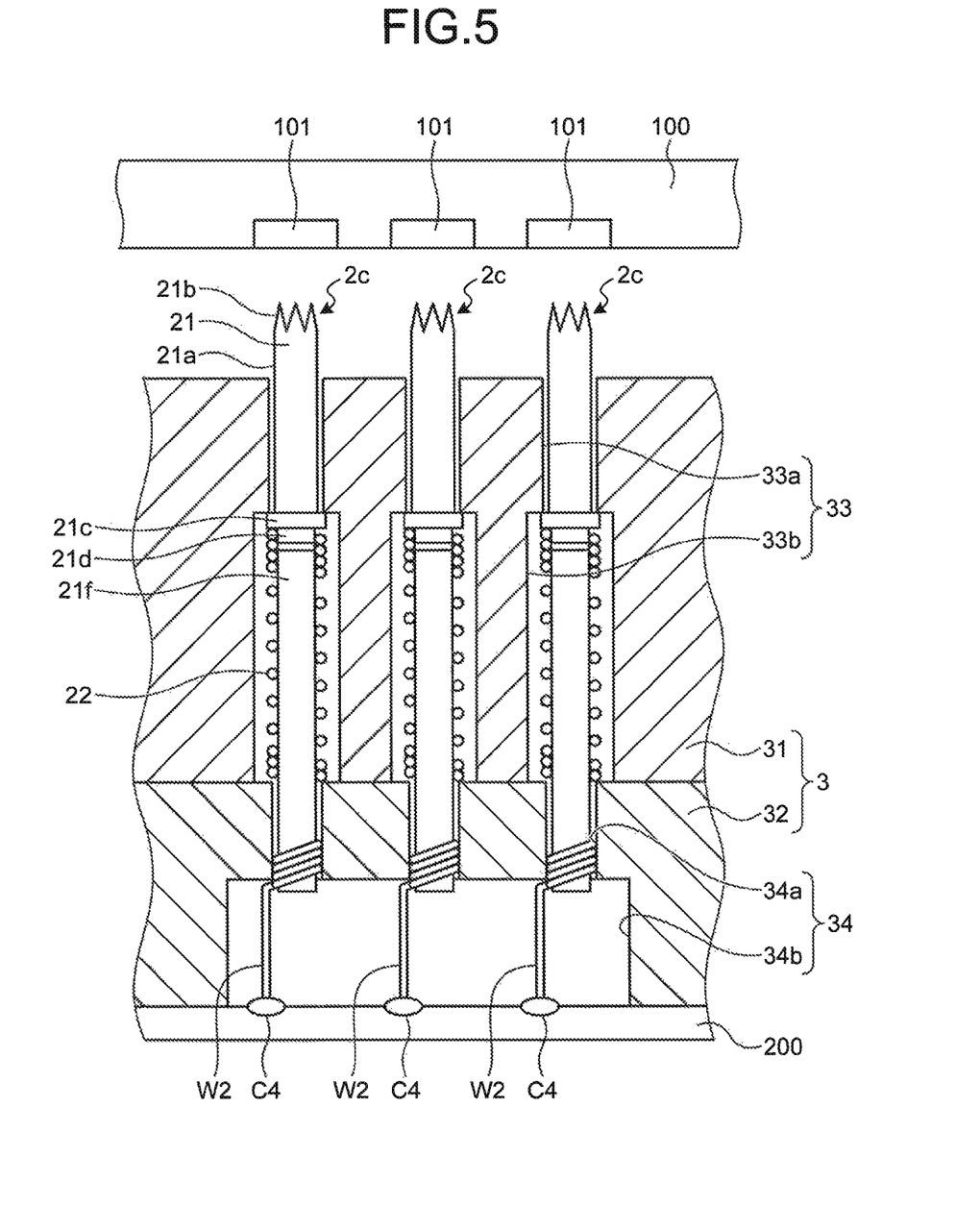
FIG. 5 is a partial cross-sectional view illustrating a configuration of an essential part of a probe unit according to a third modification of the embodiment of the present invention.

FIG. 5 is a partial cross-sectional view illustrating a configuration of an essential part of a probe unit according to a third modification of the present embodiment. The present invention is not limited to the configuration of the second modification described above, the base end portions 21e of the plungers 21 may change in length.

A probe 2c illustrated in FIG. 5 includes a base end portion 21f and a wire W2. The length of the base end portion 21f in a longitudinal direction is shorter than that of the base end portion 21e of the plunger 21 described above. The wire W2 connects between the base end portion 21f and the wiring 200. The wire W2 is wound around the base end portion 21f and fixed to the wiring 200 by a solder C4 to allow the base end portion 21f to move slidably. A portion of the wire W2 wound around the base end portion 21f is disposed in the small diameter section 34a.

Since the plunger 21 and the wiring 200 are connected by the wire W2, an electric conduction between boards can be achieved by a fewer contacts. In addition, since a protrusion length of the base end portion 21f is reduced, it is possible to downsize the probe unit.

A combination with an electric conduction between the wiring 200 and the plunger 21 contacting the probe holder 3 according to the above-described embodiment enables a larger current to flow, and heat produced by the plunger with a large current can be dissipated to the probe holder.

Figure 6:
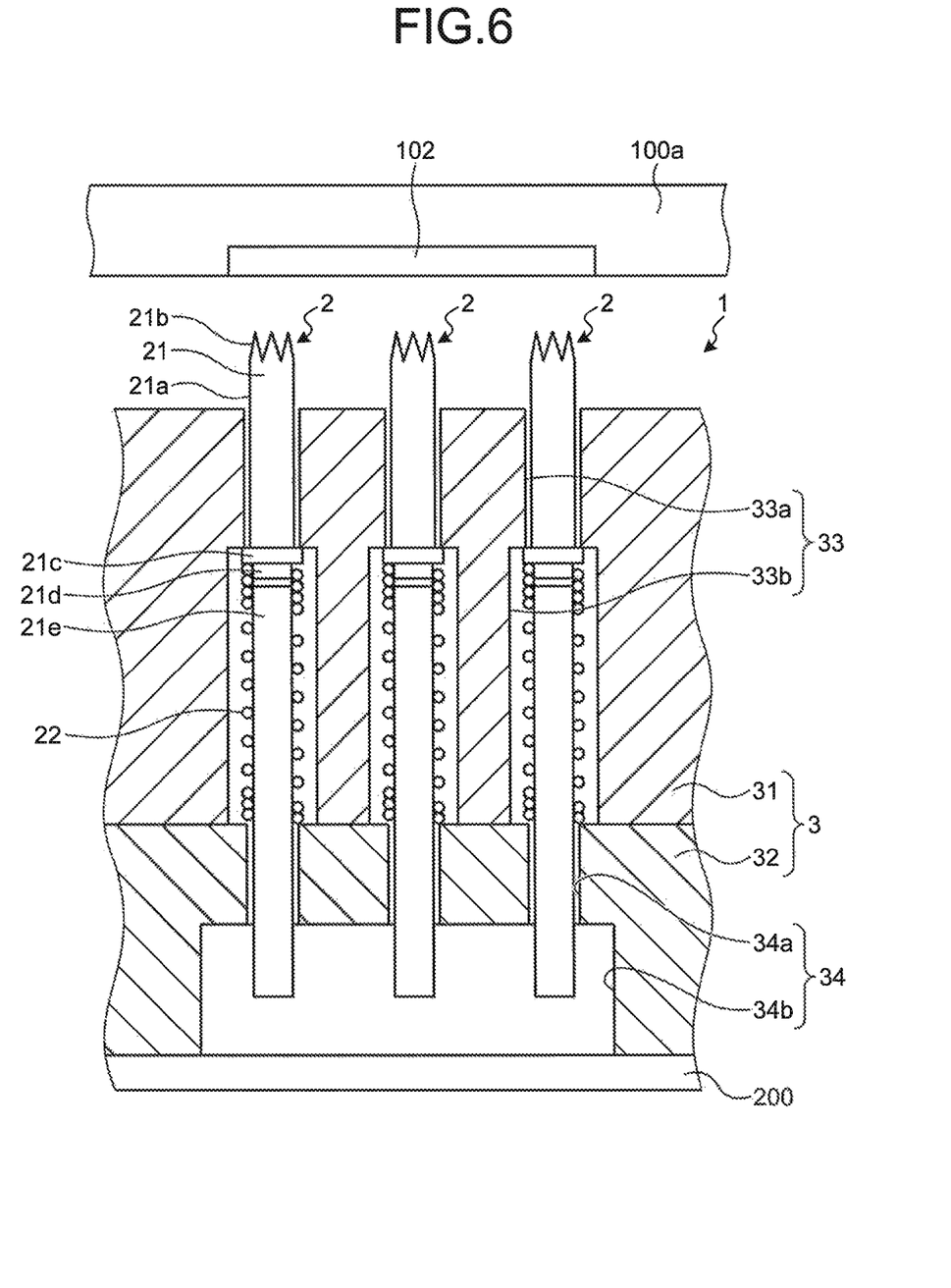
FIG. 6 is a partial cross-sectional view illustrating a configuration of an essential part of a probe unit according to a fourth modification of the embodiment the present invention.

Although the above-described embodiment was explained to be configured to make one probe contact one connection electrode 101, it may be configured to make a plurality of probes 2 contact one connection electrode 102 of a semiconductor integrated circuit 100a illustrated in FIG. 6 as a fourth modification. This enables a larger current to flow. Such a configuration can be applied to the probes 2a to 2c according to the first to third modifications described above.

INDUSTRIAL APPLICABILITY

The probe unit according to the present invention is useful for obtaining a reliable conduction between the probe unit and the contact target even if a larger current flows.

REFERENCE SIGNS LIST 1 probe unit
2, 2a, 2b, 2c contact probe (probe)
3 probe holder
21 plunger
21a end portion
21b nail portion
21c flange portion
21d boss portion
21e base end portion
22 spring coil
31 first member
32 second member
33, 34 holder hole
33a, 34a small diameter section
33b, 34b large diameter section
100, 100a semiconductor integrated circuit
101, 102 connection electrode
200 wiring

The invention claimed is:
1. A probe unit contacting an electrode of a contacted body and an electrode of a contact target at both ends in a longitudinal direction, the probe unit comprising:
   a plurality of conductive contact probes, each contacting the electrode of the contacted body at one end in the longitudinal direction; and
   a probe holder accommodating the plurality of contact probes, wherein
   each of the contact probe includes:
      a plunger including:
         a contact portion contacting the electrode of the contacted body;
         a flange portion extending from a base end of the contact portion and having a diameter larger than a diameter of the contact portion;
         a boss portion extending from an end of the flange portion different from an end continuing to the contact portion and having a diameter smaller than the diameter of the flange portion; and
         a base end portion extending from an end of the boss portion different from an end continuing to the flange portion and having a substantially same diameter with the boss portion; and
      a spring coil attached to the boss portion,
   the probe holder is made of a conductive material and includes a plurality of holder holes, each having a stepped shape in which diameters at both ends in a thickness direction are decreased and accommodating the respective contact probes, and
   the flange portion abuts one of step portions of the stepped shape, one end of the spring coil abuts the flange portion, another end of the spring coil abuts another one of the step portions such that the spring coil biases the plunger,
   the plunger is configured to abut an inner wall surface of the holder hole when a load is applied to the plunger so as to electrically connect the contacted body and the contact target via the probe holder, and
   the spring coil is made of a conductive material having a higher resistance than the plunger or made of an elastic and insulating material.
2. The probe unit according to claim 1, wherein the base end portion is connected with the electrode of the contact target by a conductive member.
3. The probe unit according to claim 2, wherein the conductive member is a wire.

4. The probe unit according to claim 3, wherein the conductive member is wound around the base end portion.

5. The probe unit according to claim 1, wherein the probe holder contacts the electrode of the contact target.

6. The probe unit according to claim 5, wherein at least one of the contact portion and the base end portion of the contact probe contacts a wall surface of the holder hole.

7. The probe unit according to claim 1, wherein the probe holder includes a large diameter section communicating with an outside thereof and being formed in an area including the holder holes.

8. The probe unit according to claim 7, wherein an end of the base end portion is positioned in the large diameter section.

* * * * *